United States Patent [19]

Lee et al.

[11] Patent Number: 5,278,096
[45] Date of Patent: Jan. 11, 1994

[54] TRANSISTOR FABRICATION METHOD

[75] Inventors: Kuo-Hua Lee, Lower Macungie Township, Lehigh County; Chen-Hua D. Yu, Allentown, both of Pa.

[73] Assignee: AT&T Bell Laboratories, Murray Hill, N.J.

[21] Appl. No.: 814,981

[22] Filed: Dec. 23, 1991

[51] Int. Cl.$^5$ .................. H01L 21/441; H01L 21/22
[52] U.S. Cl. .................. 437/162; 437/193; 437/200; 148/DIG. 1; 148/DIG. 34
[58] Field of Search .............. 148/DIG. 123, 34, 1; 437/193, 200, 437/162

[56] References Cited

U.S. PATENT DOCUMENTS

| | | | |
|---|---|---|---|
| 4,782,033 | 11/1988 | Gierisch et al. | 437/200 X |
| 5,070,038 | 12/1991 | Jin | 437/193 X |
| 5,089,432 | 2/1992 | Yoo | 437/44 X |
| 5,130,266 | 7/1992 | Huang et al. | 437/41 X |

OTHER PUBLICATIONS

Wolf et al, "Silicon Processing For The VLSI Era," Lattice Press, Sunset Beach, Calif., 1986, pp. 388–392, 325.

*Primary Examiner*—John S. Maples
*Attorney, Agent, or Firm*—John T. Rehberg

[57] ABSTRACT

A method of forming p+ transistor gates is disclosed. A polysilicon layer is covered with an amorphous silicide layer which prevents penetration of p-type dopants through the gate oxide. The silicide may be covered by a dielectric which is formed at a temperature low enough to prevent crystallization of the silicide, a p-type dopant species is directed at the silicide layer. Subsequently an anneal is performed at a temperature high enough to cause a substantial amount of the p-type dopant to move to the polysilicon layer.

10 Claims, 1 Drawing Sheet

TRANSISTOR FABRICATION METHOD

Technical Field

This invention relates to methods for semiconductor integrated circuit fabrication.

BACKGROUND OF THE INVENTION

Many CMOS integrated circuits utilize n+ gate material for both PMOS and NMOS devices. However, as gate lengths shrink, there is an increasing trend to the use of p+ gates for both PMOS and NMOS devices. P+ gate PMOS transistors (i.e., surface channel devices) exhibit good short channel performance, threshold voltages, and sub-threshold swings which are less dependent upon channel length than PMOS devices with n+ (i.e., buried channel devices) gates. P+ NMOS gate transistors have also been found satisfactory in various CMOS applications.

Typically, p+ gates are formed by depositing a polysilicon layer which is doped. The polysilicon is typically doped with boron or $BF_2$. However, if the polysilicon is doped by ion implantation with boron, the dopant species (boron) may penetrate through the polysilicon (a phenomenon termed "channeling") into the substrate and cause changes in the threshold voltage. If the polysilicon is doped with $BF_2$ (a larger species) channeling is less likely to occur. However, the presence of fluorine in the polysilicon seems to enhance boron diffusion through the gate oxide into the substrate during subsequent thermal treatments. Thus, the threshold voltage is again adversely affected.

N+ gates are typically formed from polysilicon doped with phosphorous. Since phosphorous atoms are bigger than boron atoms, channeling is a less serious problem for devices with n+ gates (assuming that the same thickness of polysilicon is employed).

One solution to the problem of channeling is to increase the thickness of the gate polysilicon material. (Gates with polysilicon thicknesses of roughly 3600 Å often have acceptable resistance to channeling for currently-used implantation energies. However, such high gates create a topography which makes subsequent processing difficult.)

Some manufacturers of comparatively thin n+ gates cover the polysilicon with tungsten silicide and then with a silicon dioxide layer. The silicon dioxide layer is formed at a temperature high enough to cause crystallization of the tungsten silicide. After the silicon dioxide is formed, the gate is implanted with an n type dopant such as phosphorous.

SUMMARY OF THE INVENTION

However, when a p type species is directed at a polysilicon gate through crystallized silicide, channeling occurs. Illustratively, applicants' invention includes:

forming a polysilicon layer overlying a substrate;

forming an amorphous refractory metal silicide layer over the polysilicon layer;

directing a p-type dopant species at the refractory metal silicide;

performing an anneal at a temperature high enough to cause a substantial amount of the p species to move to the polysilicon layer.

Another embodiment includes tonning a dielectric over the amorphous refractory metal silicide. The dielectric is formed at a temperature low enough to prevent significant crystallization of the amorphous refractory metal silicide.

BRIEF DESCRIPTION OF THE DRAWINGS

The FIGURE is a cross-sectional view which schematically aids in understanding an illustrative embodiment of the present invention.

DETAILED DESCRIPTION

Figure 1:
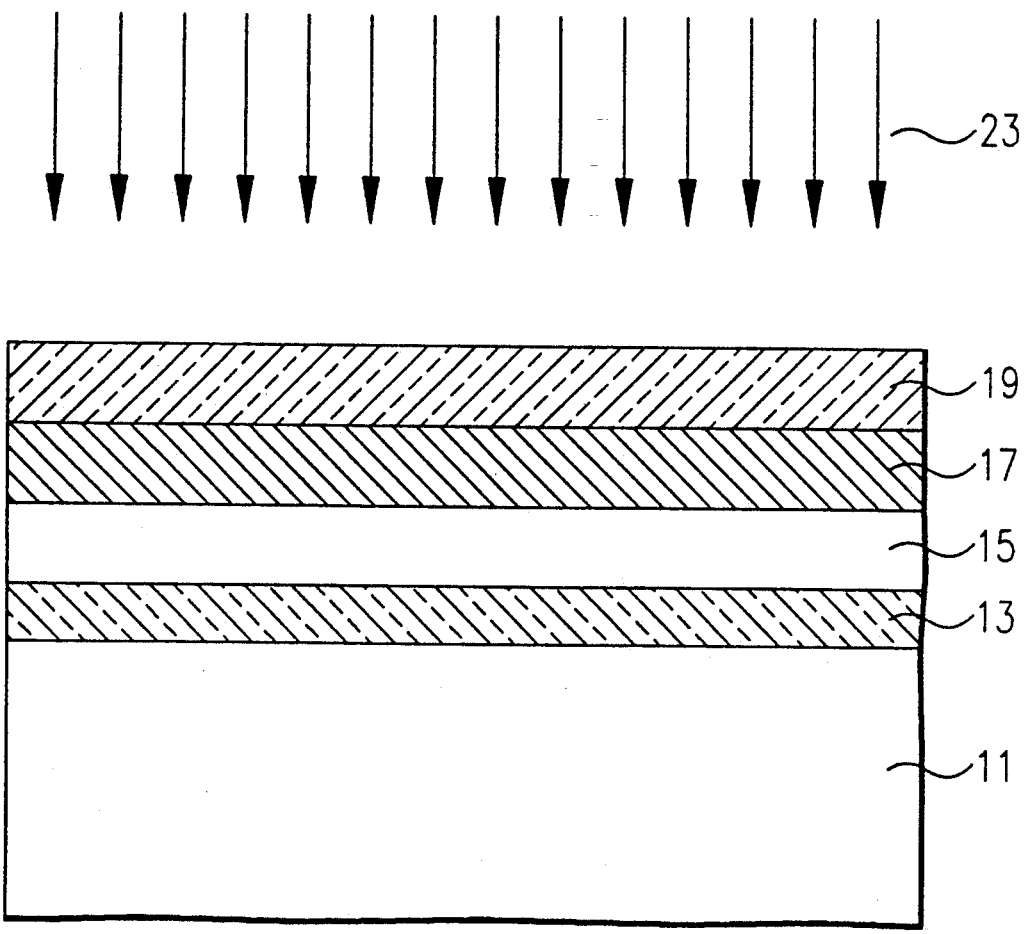

In the Figure, reference numeral 1 1 denotes a substrate which may, typically, be silicon, epitaxial silicon, or doped silicon. In general, the term substrate refers to a body having a surface upon which other materials may be formed.

Reference numeral 13 denotes an oxide layer which, typically, may be 100 Å thick. However, other thicknesses may also be used.

Reference numeral 15 denotes an undoped polysilicon layer having a thickness of approximately 1000 Å, although other thicknesses (typically between 300 Å and 3000 Å) may also be employed.

Formed upon polysilicon layer 15 is tungsten silicide layer 17. Other silicides such as tantalum silicide, or cobalt silicide, may also be used. Layer 17 is desirably formed by sputtering at a temperature between room temperature and approximately 400° C. The sputtering process produces a comparatively amorphous layer which does not exhibit grain boundaries which might promote channeling of later-implanted dopants. Typically, the thickness of layer 17 is 1000-1200 Å, although other thicknesses may also be employed. (Generally, a range of 300-3000 Å is acceptable.)

Layer 19 is formed upon layer 17. Layer 19 may be any dielectric formed at a sufficiently low temperature to prevent crystallization of silicide layer 17. For example, layer 19 may be an oxide formed by the plasma-enhanced deposition of TEOS (PETEOS) or, layer 19 may be a nitride layer formed by plasma-enhanced chemical vapor deposition (PECVD nitride). Layer 19 may also be a low temperature oxide (LTO) or a spin-on-glass (SOG).

Applicants' investigations have shown that the deposition temperature of 720° C. for layer 19 is generally too high because it promotes granularization of silicide 17. In general, deposition temperatures of less than approximately 600° C. are believed suitable. Typically, the thickness of layer 19 may be 1200Å. (Generally, a range of 300-2000Å is acceptable.) Furthermore, the low deposition temperature helps to prevent bubbling or flaking of silicide 17.

Reference numeral 23 denotes an implantation species which may be, typically, elemental boron or $BF_2$. An exemplary elemental boron implantation may be performed at 40 KEV and $5K^{15}$ dosage for a 1200Å A PETEOS layer 19. Other thicknesses or materials may require different energies. For $BF_2$, 50 KEV, $5E^{15}$ may be used directly into an amorphous silicide layer 17 (without an overlying dielectric 19—or else with approximately 200Å of dielectric 19). Both boron and $BF_2$ produce equally acceptable transistors in terms of current drive, threshold voltage control, and threshold voltage thermal stability.

Applicants' investigations have shown that the peak of the implantation dosage is near the top surface of silicide layer 17 in the as-implanted stage. Little boron penetrates into polysilicon layer 15.

After the implantation is performed, an annealing step, typically 30 minutes at approximately 900° C., is performed. The annealing step drives boron dopant from silicide 17 into polysilicon layer 15. Applicants' investigations have shown concentration of boron between $5E^{19}$ and $7E^{19}$ in both layer 17 and layer 15. Subsequent processing such as gate patterning may commence at this point.

We claim:

1. A method of semiconductor integrated circuit fabrication comprising:

forming a polysilicon layer overlying a substrate;

forming an amorphous refractory metal silicide layer over said polysilicon layer;

directing a dopant species containing boron at said refractory metal silicide thereby causing said species to implant in said silicide;

performing an anneal at a temperature high enough to cause some of said boron to move from said silicide to said polysilicon layer.

2. The method of claim 1 further including the step of forming a dielectric over said amorphous refractory metal silicide before directing said boron species, said dielectric being formed at a temperature low enough to prevent crystallization of said amorphous refractory metal silicide.

3. The method of claim 1 in which said dopant species contains boron is $BF_2$.

4. The method of claim 1 in which said directing step is ion implantation.

5. The method of claim 1 in which said refractory metal silicide is chosen from the group consisting of tungsten silicide, tantalum silicide, and cobalt silicide.

6. The method of claim 1 in which said refractory metal silicide is formed by sputtering.

7. The method of claim 6 in which said sputtering is performed at a temperature between room temperature and approximately 400° C.

8. The method of claim 2 in which said dopant species containing boron is chosen from the group consisting of B and $BF_2$.

9. The method of claim 2 in which said dielectric is chosen from the group consisting of PETEOS, LTO, SOG, and PECVD nitride.

10. A method of semiconductor integrated circuit fabrication comprising:

forming a polysilicon layer overlying a substrate;

forming an amorphous refractory metal silicide layer over said polysilicon layer;

directing a dopant species containing boron at said refractory metal silicide thereby causing said species to implant in said silicide;

performing an anneal at a temperature high enough to cause some of said boron to move from said silicide to said polysilicon layer and patterning said polysilicon layer and said amorphous refractory metal silicide layer to form a gate.

* * * * *